(12) United States Patent
Seo et al.

(10) Patent No.: US 8,183,063 B2
(45) Date of Patent: May 22, 2012

(54) ORGANIC LIGHT EMITTING DEVICE AND METHOD OF FABRICATING THE SAME

(75) Inventors: Chang-Su Seo, Suwon-si (KR);
Moon-Hee Park, Suwon-si (KR);
Tae-Wook Kang, Suwon-si (KR);
Hyun-Eok Shin, Suwon-si (KR);
Sung-Sik Bae, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 247 days.

(21) Appl. No.: 12/506,625

(22) Filed: Jul. 21, 2009

(65) Prior Publication Data

US 2009/0280590 A1  Nov. 12, 2009

Related U.S. Application Data

(62) Division of application No. 11/138,857, filed on May 27, 2005, now Pat. No. 7,579,767.

(30) Foreign Application Priority Data

May 28, 2004   (KR) .............................. 2004-0038534

(51) Int. Cl.
*H01L 21/00* (2006.01)
(52) U.S. Cl. ..................... 438/22; 257/57; 257/E21.002
(58) Field of Classification Search ............... 438/22, 438/28, 30, 48, 128, 149, 151, 157, 161, 438/283; 257/E21.002, 57, 59, 72, 83, 257, 257/290, 351, 368, 392
See application file for complete search history.

(56) References Cited

U.S. PATENT DOCUMENTS

| | | | |
|---|---|---|---|
| 6,812,052 B2 * | 11/2004 | Lu ................................... | 438/29 |
| 2003/0234608 A1 * | 12/2003 | Lee et al. ...................... | 313/504 |
| 2004/0079937 A1 | 4/2004 | Miyazawa | |
| 2005/0007015 A1 | 1/2005 | Yokoyama et al. | |

FOREIGN PATENT DOCUMENTS

| | | |
|---|---|---|
| CN | 1446028 | 10/2003 |
| CN | 1468038 | 1/2004 |
| EP | 1511081 A2 | 3/2005 |
| JP | 2003-288994 | 10/2003 |
| JP | 2003-317971 | 11/2003 |
| JP | 2004-031324 | 1/2004 |

(Continued)

OTHER PUBLICATIONS

International Search Report dated Sep. 13, 2005.

(Continued)

*Primary Examiner* — Tony Tran
(74) *Attorney, Agent, or Firm* — H.C. Park & Associates, PLC

(57) ABSTRACT

An organic light emitting device (OLED) and a method of fabricating the same are provided, wherein the OLED includes a thin film transistor having a gate electrode, and source and drain electrodes on a substrate; a triple-layered pixel electrode connected to one of the source and drain electrodes through a via-contact hole formed in an insulating layer on the substrate, and having a lower pixel electrode, a reflective layer pattern and an upper pixel electrode; an organic layer disposed on the upper pixel electrode and having at least an emission layer; and an opposite electrode disposed on the organic layer.

6 Claims, 4 Drawing Sheets

FOREIGN PATENT DOCUMENTS

| | | |
|---|---|---|
| KR | 10-2003-0094656 | 12/2003 |
| KR | 10-2004-0000630 | 1/2004 |

OTHER PUBLICATIONS

CN Office Action dated Jan. 4, 2008.

Office Action dated Mar. 20, 2008 (for co-pending U.S. Appl. No. 11/138,857).

Office Action dated Sep. 11, 2008 (for co-pending U.S. Appl. No. 11/138,857).

Notice of Allowance dated Apr. 22, 2009 (for co-pending U.S. Appl. No. 11/138,857).

\* cited by examiner

ORGANIC LIGHT EMITTING DEVICE AND METHOD OF FABRICATING THE SAME

CROSS-REFERENCE TO RELATED APPLICATIONS

This application is a divisional application of U.S. patent application Ser. No. 11/138,857, filed on May 27, 2005, and claims the benefit of Korean Patent Application No. 2004-38534, filed May 28, 2004, which are hereby incorporated by reference for all purposes as if fully set forth herein.

BACKGROUND OF THE INVENTION

1. Field of the Invention

The present invention relates to an organic light emitting device (OLED) and a method of fabricating the same and, more particularly, to an OLED and a method of fabricating the same, which includes a pixel electrode with a triple-layered structure, having a reflective layer made of Ag interposed, therein.

2. Description of the Related Art

In general, an OLED is an emissive display device electrically exciting a fluorescent organic compound to emit light. The OLED is classified into a passive matrix OLED and an active matrix OLED depending on the type of driving N×M pixels. The active matrix OLED (AMOLED) is used with large screen displays and has high resolution. Further, the AMOLED consumes less power than the passive matrix OLED (PMOLED).

The OLED is further classified into a top emission OLED, a bottom emission OLED, and a both sides emission OLED depending on the direction of light emitted from an organic compound. The both sides emission OLED simultaneously performs top and bottom emission. The top emission OLED, i.e., a device for emitting light in an opposite direction of a substrate, at which unit pixels are disposed, has a higher aperture ratio than that of the bottom emission OLED.

Demand for the both sides emission OLED including a main display window of the top emission OLED and an auxiliary display window of the bottom emission OLED is increasing. The both sides emission OLED is commonly used in mobile phones, which includes an auxiliary display window at an outer part and a main display window at an inner part. The auxiliary display window uses less power than the main display window to continuously maintain an "on" state when the mobile phone is in a standby state, thereby displaying, for example, a signal receiving state, a battery state of charge, current time, etc., of the mobile phone.

FIG. 1A is a cross-sectional view of a conventional OLED. First, a buffer layer 110 of a predetermined thickness is formed on a substrate 100, and then a thin film transistor including a polysilicon pattern 122, a gate electrode 132, and source and drain electrodes 150 and 152 is formed. Source and drain regions 120, at which impurities are ion implanted, are provided at both sides of the polysilicon pattern 122, and a gate insulating layer 130 is disposed on an entire surface of the resultant structure.

A passivation layer 160 of a predetermined thickness is then formed on the entire surface of the resultant structure, and the passivation layer 160 is etched by photolithography and etching processes to form a first via-contact hole (not shown) to expose one of the source and drain electrodes 150 and 152, for example, the drain electrode 152. The passivation layer 160 is an organic insulating layer formed of silicon nitride, silicon oxide, or a stacked structure thereof.

A first insulating layer 170 is then formed on the entire surface of the resultant structure. The first insulating layer 170 may be formed of a material selected from a group consisting of polyimide, benzocyclobutene-based resin, spin on glass (SOG), acrylate, and the like, which is formed to planarize a pixel region.

The first insulating layer 170 is etched by the photolithography and etching processes to form a second via-contact hole (not shown) to expose the first via-contact hole.

A stacked structure of a reflective layer (not shown) and a thin layer for a pixel electrode (not shown) is then formed on the entire surface of the resultant structure. The reflective layer is formed of a highly reflective metal, such as Al, Mo, Ti, Au, Ag, Pd, or an alloy thereof. When the reflective layer is formed according to the above described process, the top emission OLED is formed, and when the reflective layer is formed according to the process described below, the bottom emission OLED is formed.

The bottom emission OLED is formed with a thin layer for the pixel electrode having a thickness of approximately 10 Å to −300 Å, using a transparent metal material, such as ITO (indium tin oxide).

The stacked structure is etched by the photolithography and etching processes to form a pixel electrode 182 and a reflective layer pattern 180a.

A second insulating layer pattern 190 for defining an emission region is then formed on the entire surface of the resultant structure. The second insulating layer pattern 190 may be formed of one material selected from a group consisting of polyimide, benzocyclobutene-based resin, phenol resin, acrylate, and the like.

An emission layer 192 is formed in the pixel region defined by the second insulating layer pattern 190 using a low molecule deposition method or a laser induced thermal imaging method. An opposite electrode (not shown) is formed to complete the OLED. For example, when forming the top emission OLED, the opposite electrode is formed of a transparent electrode or a transparent metal electrode, and when forming the bottom emission OLED, the opposite electrode is formed of a metal electrode or a reflective electrode including a reflective layer.

Thus, when the top emission OLED is formed in a stack-like structure of the reflective layer pattern 180a and the pixel electrode 182, the reflective layer pattern 180a and the pixel electrode 182 are simultaneously exposed to an electrolyte solution used in the photolithography and etching processes, resulting in a galvanic phenomenon when a material having large electromotive force of the stacked structure is corroded, thereby damaging the pixel electrode. As a result, optical characteristics, such as brightness, are deteriorated.

FIG. 1B is a cross-sectional view of an OLED formed by another conventional process. Referring to FIG. 1B, to solve the problems, a reflective layer pattern 180b is formed having an island structure. Thus, the reflective layer pattern 180b and the pixel electrode 182 may not be simultaneously exposed to the electrolyte solution used in the photolithography and etching processes.

As described above, when the reflective layer pattern is formed of Al, the reflective layer pattern and the pixel electrode should be separately patterned. In addition, since the top emission OLED uses a resonance effect of light, it is important to allow color coordinates to be readily adjusted by forming the pixel electrode as thin as possible. However, when a thin pixel electrode is formed a short circuit is likely to be generated at a step portion of the via-contact hole.

SUMMARY OF THE INVENTION

The present invention, therefore, solves aforementioned problems associated with conventional devices by providing an OLED and a method of fabricating the same capable of improving electrical characteristics and optical characteristics of the device by forming a stacked structure of a lower pixel electrode, a reflective layer pattern using Ag and an upper pixel electrode, as a pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be described more fully hereinafter with reference to the accompanying drawings, in which embodiments of the invention are shown.

Figure 1A:
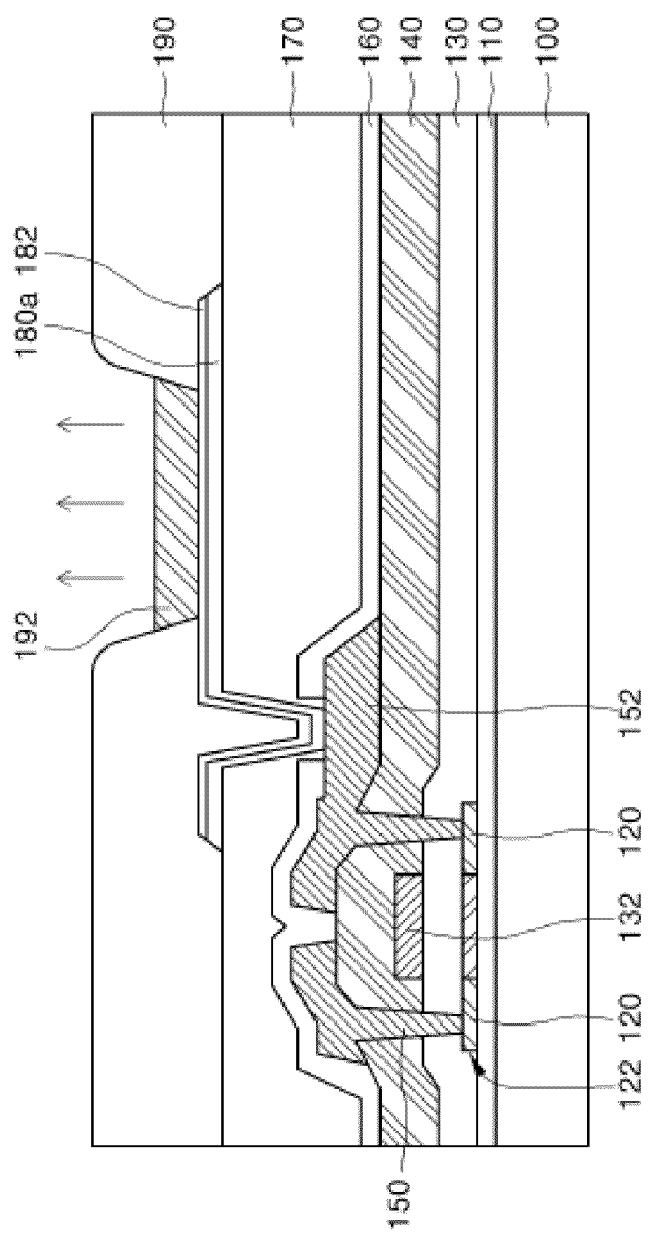
FIG. 1A is a cross-sectional view of an OLED formed by conventional operations.
Figure 1B:
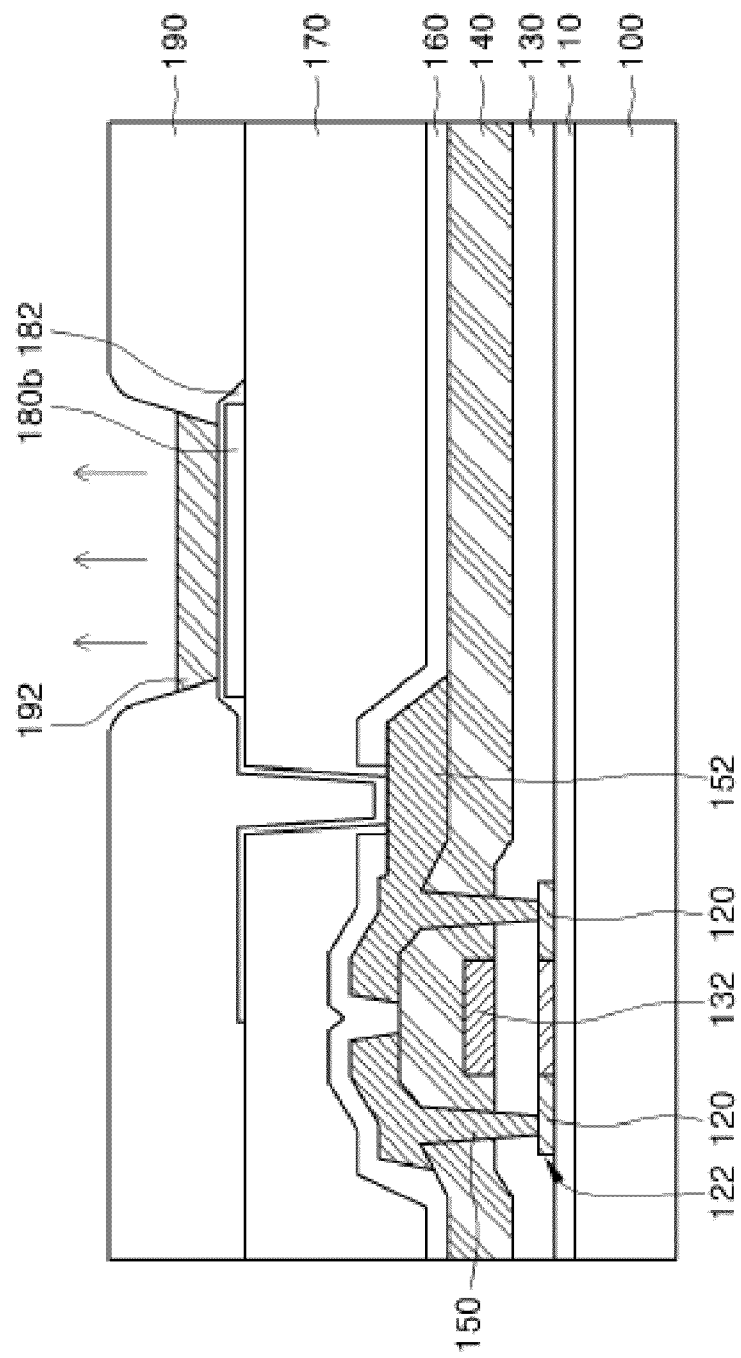
FIG. 1B is a cross-sectional view of an OLED formed by other conventional operations.
Figure 2:
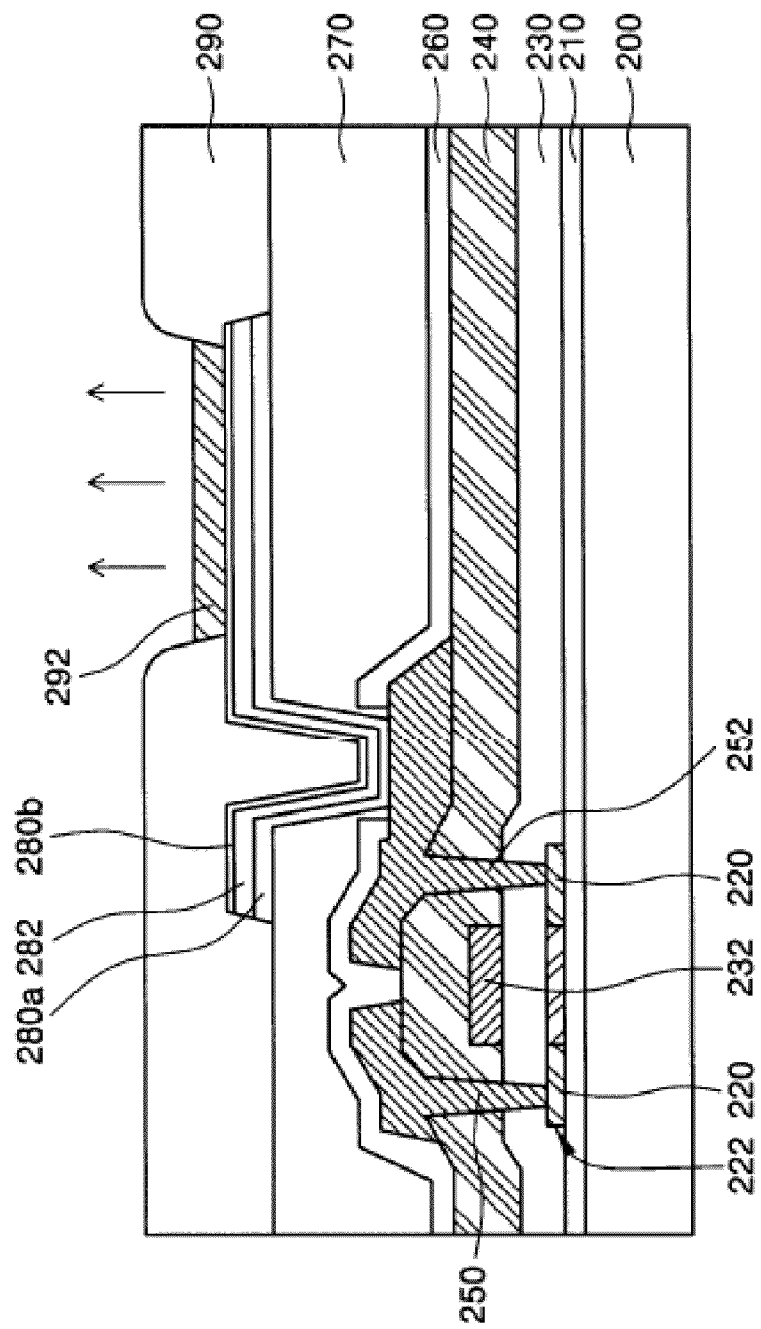
FIG. 2 is a cross-sectional view of an OLED according to an embodiment of the invention.

FIG. 2 is a cross-sectional view of an OLED according to an embodiment of the invention, including a triple-layered pixel electrode having a lower pixel electrode 280a, a reflective layer pattern 282 and an upper pixel electrode 280b on a substrate 200. As the lower pixel electrode 280a is thicker than the upper pixel electrode 280b, and the reflective layer pattern 282 may be formed of Ag.

The organic light emitting display may be formed according to the following operations.

A buffer layer 210 having a predetermined thickness is formed on an entire surface of a substrate 200 made of glass, quartz, sapphire, or the like. The buffer layer 210 may be formed of silicon oxide using a plasma-enhanced chemical vapor deposition (PECVD) method. The buffer layer 210 prevents impurities in the substrate 200 from diffusing during a crystallization process of an amorphous silicon layer, which is to be formed on the substrate.

An amorphous silicon layer (not shown) having a predetermined thickness is provided on the buffer layer 210 and is crystallized using an excimer laser annealing (ELA) technique, a sequential lateral solidification (SLS) technique, a metal induced crystallization (MIC) technique or a metal induced lateral crystallization (MILC) technique, and patterned by photolithography and etching processes to form a polysilicon pattern 222 in a thin film transistor region of a unit pixel. The polysilicon pattern 222 also includes source and drain regions 220, which are subsequently formed.

A gate insulating layer 230 having a predetermined thickness is subsequently formed on the entire surface of the resultant structure. The gate insulating layer 230 may be formed of silicon oxide, silicon nitride, or a stacked structure thereof.

A metal layer (not shown) used as a gate electrode is formed on the gate insulating layer 230. The metal layer may be a single layer structure such as Al or an aluminum alloy, e.g., Al-Nd, or a multi-layer structure having the single layer structure stacked on an additional layer formed of Cr or Mo alloy. The metal layer is subsequently etched by photolithography and etching processes to form a gate electrode 232. Then, impurities are ion implanted into the polysilicon pattern 222 at both lower parts of the gate electrode 232 to form the source and drain regions 220.

An interlayer dielectric 240 having a predetermined thickness is subsequently formed on the entire surface of the resultant structure. For example, the interlayer dielectric 240 may be made of silicon nitride.

The interlayer dielectric 240 and the gate insulating layer 230 are subsequently etched by photolithography and etching processes to form a contact hole (not shown) for exposing the source and drain regions 220. An electrode material is formed on the entire surface, including in the contact hole, and etched by the photolithography and etching processes to form source and drain electrodes 250 and 252 connected with the source and drain regions 220. The electrode may be made of MoW, Al-Nd, or a stacked structure thereof.

A passivation layer 260 made of, silicon nitride, silicon oxide, or a stacked structure, thereof, and having a predetermined thickness is deposited on the entire surface of the resultant structure.

The passivation layer 260 is etched by photolithography and etching processes to form a first via-contact hole (not shown) to expose one of the source and drain electrodes 250 and 252, for example, the drain electrode 252.

A first insulating layer 270 is subsequently formed on the entire surface of the resultant structure. The first insulating layer 270 is formed having a thickness sufficient to planarize an entire thin film transistor region, and may be formed of polyimide, benzocyclobutene based resin, spin on glass (SOG), acrylate, or the like.

The first insulating layer 270 is subsequently etched using photolithography and etching processes to form a second via-contact hole (not shown) to expose one of the source and drain electrodes 250 and 252 through the first via-contact hole.

A thin layer for a lower pixel electrode (not shown) is subsequently formed on the entire surface of the resultant structure. The thin layer for the lower pixel electrode is approximately of 100 to 1000 Å thick and made of a transparent metal electrode, such as ITO (indium tin oxide), IZO, $In_2O_3$ or $Sn_2O_3$. The thin layer for the lower pixel electrode improves interface characteristics, e.g., adhesion, between the first insulating layer 270 and a reflective layer (not shown), which is subsequently formed on the thin layer.

The reflective layer increases brightness and luminous efficiency by reflecting light. The reflective layer may be formed of Ag, Pd, Pt or the like having a reflectivity of approximately 80%. The reflective layer is approximately 500 to 3000 Å thick.

A thin layer for an upper pixel electrode (not shown) is subsequently formed on the entire surface of the resultant structure. The thin layer for the upper pixel electrode is approximately 10 to 300 Å thick, preferably 20~100 Å thick, to facilitate adjustment of color coordinates.

The stacked structure of the thin layer for the upper pixel electrode, the reflective layer, and the thin layer for the lower pixel electrode is subsequently etched by photolithography and etching processes to form a triple-layered pixel electrode having an upper pixel electrode 280b, a reflective layer pattern 282, and a lower pixel electrode 280a. A portion of the lower pixel electrode 282a is connected with one of the source and drain electrodes 250 and 252, for example, the drain electrode 252, through a second via-contact hole. Although the thin layers for pixel electrodes and the reflective layer are simultaneously exposed to an electrolyte solution used during the etching process, galvanic phenomena do not occur.

A second insulating layer (not shown) is subsequently formed on the entire surface of the resultant structure. The second insulating layer is etched by photolithography and etching processes to form a second insulating layer pattern 290 defining an emission region.

An emission layer 292 is subsequently formed on the emission region exposed by the second insulating layer pattern 290. The emission layer 292 is formed by a low molecule deposition method, a laser induced thermal imaging method, or the like. The emission layer 292 may be formed of at least one thin layer selected from a group consisting of an electron injection layer, an electron transport layer, a hole injection layer, a hole transport layer, a hole blocking layer, and an organic emission layer (see FIG. 2).

An opposite electrode (not shown) is formed of a transparent electrode and completes the organic light emitting display.

Figure 3:
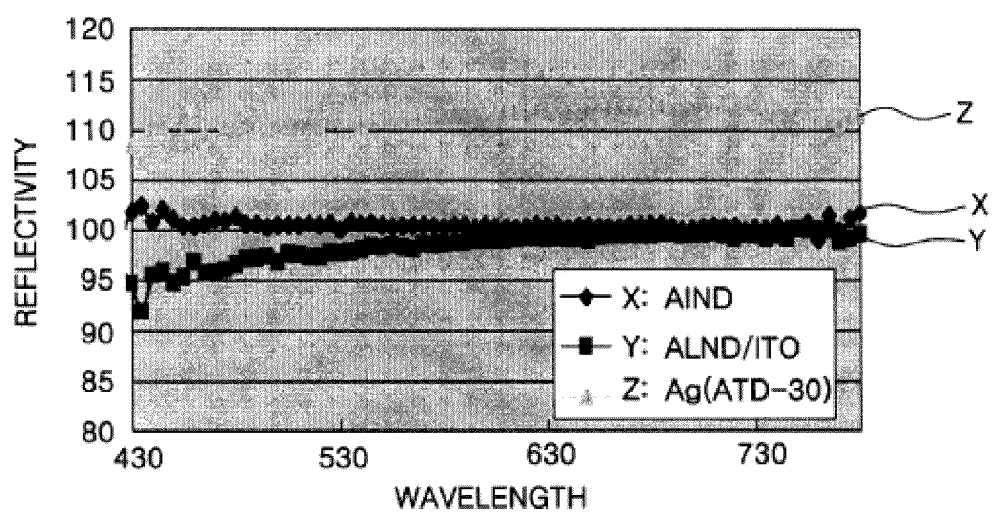
FIG. 3 is a graph showing reflectivity depending on a type of reflective layer.

FIG. 3 is a graph showing reflectivity depending on a type of reflective layer. Specifically, the graph shows reflectivity depending on a wavelength of light (X) when the reflective layer is formed of AlNd, (Y) when ITO is formed on the reflective layer formed of AlNd, and (Z) when the reflective layer is formed of Ag. When the reflective layer is formed of Ag, the Ag uses ATD-30 (trade name), one of Ag alloys. As shown in the graph, (Z) when the reflective layer is formed of Ag, the reflectivity is approximately 15% greater than when the reflective layer is formed of AlNd or when ITO is formed on the reflective layer formed of AlNd, regardless of the wavelength of light.

Figure 4:
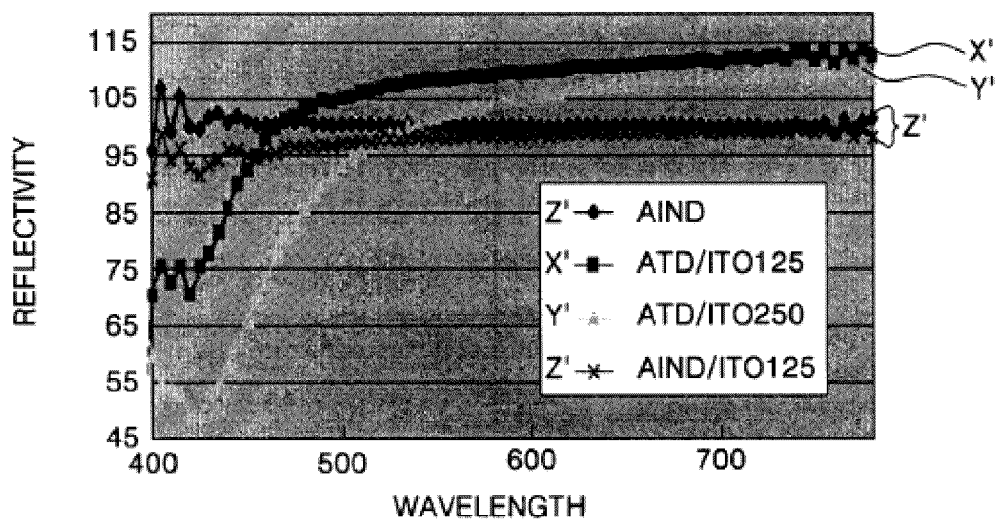
FIG. 4 is a graph showing reflectivity depending on a type of reflective layer and the thickness of a pixel electrode.

FIG. 4 is a graph showing reflectivity depending a type of reflective layer and a thickness of a pixel electrode. Specifically, the graph shows reflectivity depending on wavelength of light (X') and (Y') when the reflective layer is formed of Ag, and (Z') when the reflective layer is formed of AlNd. The reflectivities depending on the wavelength of light are shown when thicknesses of the pixel electrode are approximately 125 Å thick (X') and approximately thick 250 Å (Y'). When the pixel electrode formed on the reflective layer is approximately 250 Å thick, the reflectivity decreases when the wavelength is less than approximately 500 Å. Therefore, when the reflective layer is made of Ag, there are less variations of reflectivity depending on the wavelength of light as the thickness of pixel electrode decreases.

According to the above described embodiment of the invention, reflectivity may be improved by forming the reflective layer using Ag. The process may be simplified since the pixel electrode and the reflective layer may be simultaneously patterned. Further, interface characteristics between the reflective layer and the organic insulating layer may be improved by using the triple-layered structure having the lower pixel electrode, the reflective layer pattern and the upper pixel electrode. Further, luminous efficiency may be improved by forming the upper pixel electrode capable of optimizing characteristics of the reflective layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an organic light emitting device, comprising:
   forming a thin film transistor having a gate electrode and source and drain electrodes on a substrate;
   forming an insulating layer on an entire surface of the thin film transistor;
   etching the insulating layer using photolithography and etching processes to form a via-contact hole that exposes one of the source and drain electrodes;
   forming a stacked structure comprising a layer for a lower pixel electrode, a reflective layer, and a layer for an upper pixel electrode, on the entire surface of the resultant structure;
   etching the stacked structure to form a triple-layered pixel electrode connected with one of the source and drain electrodes through the via-contact hole, and having a lower pixel electrode, a reflective layer pattern and an upper pixel electrode;
   forming an organic layer having at least an emission layer on the upper pixel electrode; and
   forming an opposite electrode on the organic layer,
   wherein,
   the lower pixel electrode is approximately 100 Å to 1000 Å thick,
   the upper pixel electrode is approximately 20 to 100 Å thick,
   the lower pixel electrode is thicker than the upper pixel electrode,
   the reflective layer pattern is disposed between and is directly contacting the lower pixel electrode and the upper pixel electrode,
   wherein the insulating layer is formed in a stacked structure comprising an inorganic insulating layer and an organic insulating layer, and
   wherein the reflective layer pattern is formed having a thickness of approximately 500 to 3000 Å.

2. The method of claim 1, wherein the insulating layer is formed in a stacked structure comprising a passivation layer and a planarization layer.

3. The method of one of claim 1, wherein the via-contact is formed by twice performing the photolithography and etching processes.

4. The method of claim 1, wherein the reflective layer pattern is formed of one selected from a group consisting of Ag, Pt, and Pd.

5. The method of claim 4, wherein the reflective layer pattern comprises Ag.

6. The method of claim 1, wherein the opposite electrode is formed of a transparent electrode.

* * * * *